United States Patent

Tsang et al.

Patent Number: 6,052,072
Date of Patent: Apr. 18, 2000

[54] SYSTEM AND SCHEME FOR MAXIMUM TRANSITION RUN LENGTH CODES WITH LOCATION DEPENDENT CONSTRAINTS

[75] Inventors: Kinhing P. Tsang, Plymouth; Bernardo Rub, Edina, both of Minn.

[73] Assignee: Seagate Technology, Inc., Scotts Valley, Calif.

[21] Appl. No.: 09/052,485

[22] Filed: Mar. 13, 1998

Related U.S. Application Data

[60] Provisional application No. 60/042,518, Apr. 1, 1997.

[51] Int. Cl.$^7$ ........................... H03M 7/46
[52] U.S. Cl. ........................... 341/59; 341/50
[58] Field of Search ........................... 341/59, 58, 50, 341/68, 69, 70, 71, 72, 73

[56] References Cited

U.S. PATENT DOCUMENTS

| | | | |
|---|---|---|---|
| 5,341,386 | 8/1994 | Shimoda et al. | 371/43 |
| 5,451,943 | 9/1995 | Satomura | 341/58 |
| 5,502,735 | 3/1996 | Cooper | 371/43 |
| 5,553,169 | 9/1996 | Mizuoka | 382/282 |
| 5,576,707 | 11/1996 | Zook | 341/58 |
| 5,731,768 | 3/1998 | Tsang | 341/59 |
| 5,859,601 | 1/1999 | Moon et al. | 341/59 |

OTHER PUBLICATIONS

J. Moon et al. "Maximum transition run codes for data storage system," IEEE Transaction on Magnetics, vol. 32, No. 5, Sep. 1996.

B. Brickner et al. "A high–dimensional signal space implementation of FDTS/DF", IEEE Transaction on Magnetics, vol. 32, No. 5, Sep. 1996.

*Primary Examiner*—Brian Young
*Attorney, Agent, or Firm*—Westman, Champlin & Kelly, P.A.

[57] ABSTRACT

A method and apparatus for encoding data produces a code stream of code words, where each code word includes two subsets of code bits. Each subset of code bits is constrained by a different maximum transition run constraint. In an alternative embodiment, the method and apparatus produces a code stream comprised of alternating even bit locations and odd bit locations, where the even bit locations are constrained by a different maximum run length constraint than the odd bit locations.

21 Claims, 4 Drawing Sheets

SYSTEM AND SCHEME FOR MAXIMUM TRANSITION RUN LENGTH CODES WITH LOCATION DEPENDENT CONSTRAINTS

REFERENCE TO CO-PENDING APPLICATION

This application claims priority benefits from U.S. provisional patent application Ser. No. 60/042,518 entitled "MAXIMUM TRANSITION RUN LENGTH CODES WITH LOCATION DEPENDENT CONSTRAINTS" filed on Apr. 1, 1997.

Cross-reference is also made to U.S. application Ser. No. 08/052,582 entitled "LOCATION DEPENDENT MAXIMUM TRANSITION RUN LENGTH CODE WITH ALTERNATING CODE WORD LENGTHS AND EFFICIENT K CONSTRAINT" filed on even-date herewith.

FIELD OF THE INVENTION

The present invention relates to encoding systems. In particular, the present invention relates to encoding systems in disc drives.

BACKGROUND OF THE INVENTION

In the field of digital communications, digital information is conveyed from a transmitter to a receiver through a channel. "Channel" is a generalized term that can include many things. For instance, in satellite communication systems, the channel consists of the atmosphere between the earth-bound transmitter and the satellite. In data storage devices, such as magnetic disc drives, the channel includes a storage medium where the signal is stored for some period of time before being delivered to the receiver.

All channels introduce noise into the signals they convey. To detect and sometimes to correct signal errors caused by this channel noise, the art has developed a large number of coding techniques. These coding techniques convert data words formed of a number of data bits, m, into larger code words formed of a number of code bits, n. The additional bits in the code words permit the detection and sometimes the correction of errors in the signals received from the channel.

The ratio of the number of data bits to the number of code bits, m/n, is known as the code rate of the code. In general, the ability to detect and correct errors in a received signal increases as the code rate decreases because a lower code rate means a greater number of additional bits in the code word. However, each additional bit added by the encoder increases the time and energy needed to transmit the signal through the channel. Thus, to minimize the time and energy needed to send the code, the code rate should be maximized. A lower code rate results in more bit crowding, which reduces error rate performance.

In one type of coding, known as non-return-to-zero-inverse (NRZI), every digital one in a code word is represented by a transition in the transmitted signal, and every digital zero is represented by a lack of transitions in the transmitted signal. To allow the receiver to generate a clock signal using a phase lock loop and the received signal, the encoded signal is generally limited so that the number of consecutive zeros is no greater than a maximum number "k". This kind of code is known as a run-length-limited (RLL) code with a "k" constraint. It is also known to limit the number of consecutive ones in an encoded value to limit the effects of inter-symbol interference, which occurs when consecutive transitions in the transmitted signal interfere with each other. Such codes are known as maximum transition run (MTR) codes with an "L" constraint, where L is the maximum number of consecutive transitions allowed in the channel signal. For example, to avoid three or more consecutive transitions, codes with an MTR constraint L=2 can be designed.

Although MTR codes reduce inter-symbol interference, they eliminate a large number of available code words making it difficult and sometimes impossible to implement MTR constraints with high rate codes. MTR codes improve the bit-error rate by eliminating the most error prone patterns, which in turn limits the code rate achievable with a given MTR constraint.

The present invention addresses this and other problems, and offers other advantages over the prior art.

SUMMARY OF THE INVENTION

A method and apparatus for encoding data produces a code stream of code words, where each code word includes two subsets of code bits. Each subset of code bits is constrained by a different maximum transition run constraint.

In an alternative embodiment, the method and apparatus produces a code stream comprised of alternating even bit locations and odd bit locations, where the even bit locations are constrained by a different maximum run length constraint than the odd bit locations. In preferred embodiments, even bit locations within the code stream have a maximum transition run constraint of three and odd bit locations within the code stream have a maximum transition run constraint of two.

In further embodiments of the present invention, the code stream is formed through a series of concatenated even and odd code words. Even code words within the code stream have maximum transition run constraints of two for the code words' odd bit locations and three for the code words' even bit locations. For odd code words, the maximum transition run constraints are two for the code words' even bit locations and three for the cod words' odd bit locations.

DETAILED DESCRIPTION OF THE PREFERRED EMBODIMENTS

Figure 1:
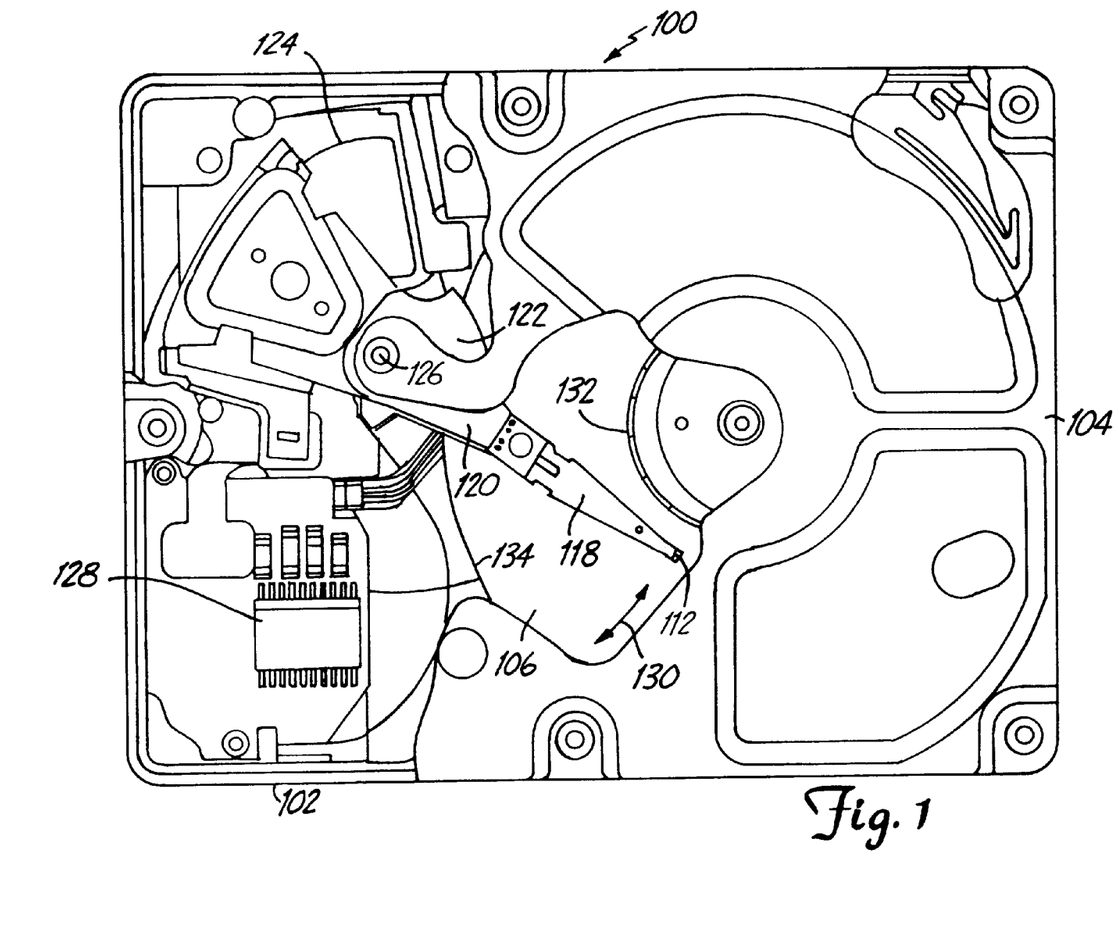
FIG. 1 is a plan view of a disc drive.

FIG. 1 is a plan view of a disc drive 100 that includes a housing with a base plate 102 and a top cover 104 (sections of top cover 104 are removed for clarity). Disc drive 100 further includes a disc pack 106, which is mounted on a spindle motor (not shown). Disc pack 106 can include a plurality of individual discs which are mounted for co-rotation about a central axis. Each disc surface has an associated head gimbal assembly (HGA) 112 which is mounted to disc drive 100 for communication with the disc surface. Each HGA 112 includes a gimbal and a slider, which carries one or more read and write heads. Each HGA 112 is supported by a suspension 118 which is in turn attached to a track accessing arm 120 known generally as a fixture, of an actuator assembly 122.

Actuator assembly 122 is rotated about a shaft 126 by a voice coil motor 124, which is controlled by servo control circuitry within internal circuit 128. HGA 112 travels in an arcuate path 130 between a disc inner diameter 132 and a disc outer diameter 134. When the head is properly positioned, write circuitry within internal circuitry 128 encodes data for storage on the disc and sends an encoded signal to the head in HGA 112, which writes the information to the disc. At other times, the read head in HGA 112 reads stored information from the disc and provide a recovered signal to detector circuitry and decoder circuitry within internal circuitry 128 to produce a recovered data signal.

Figure 2:
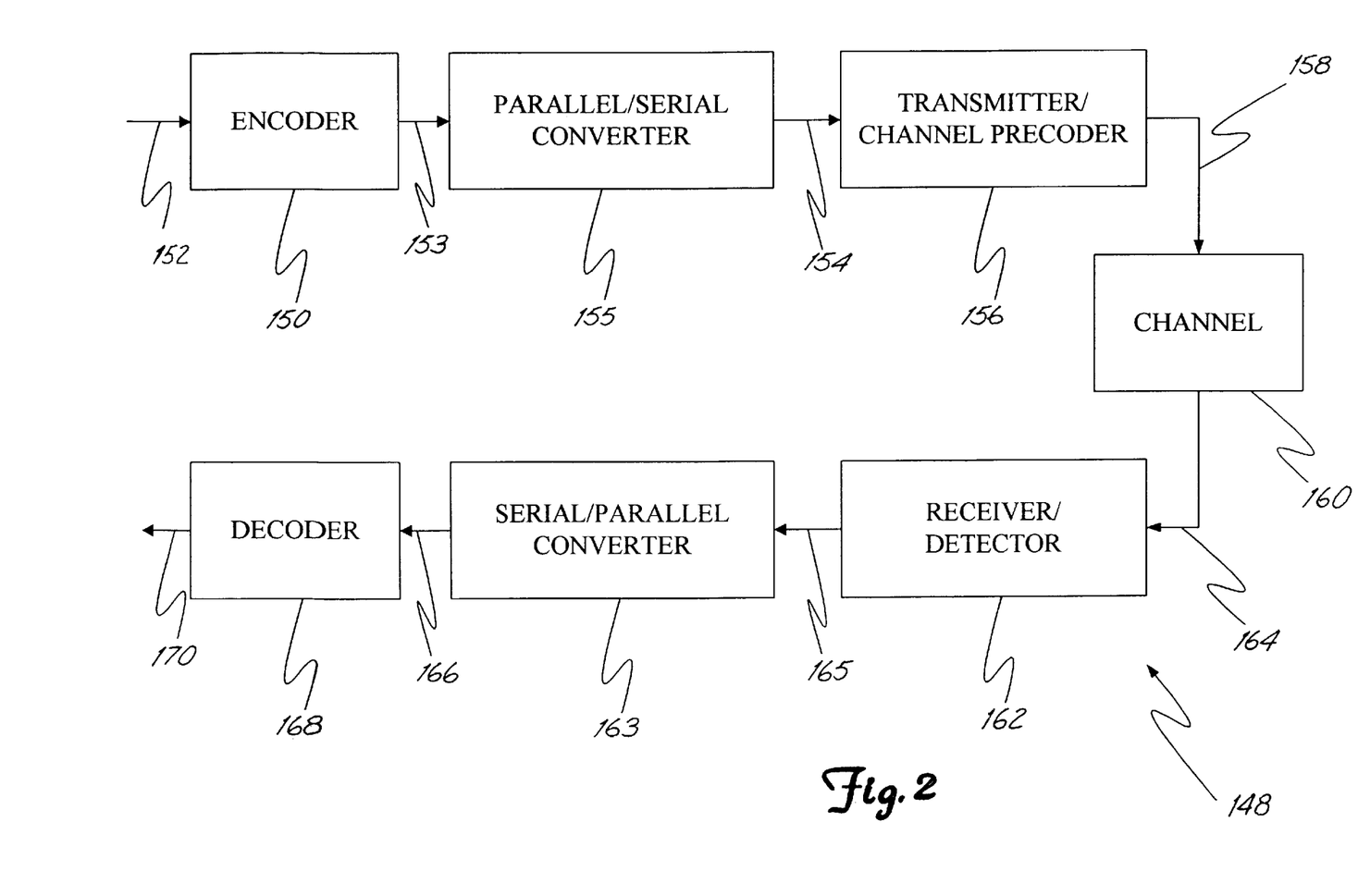
FIG. 2 is a block diagram of a coding system of the present invention.

FIG. 2 is a block diagram of a generalized communication system 148 used with the present invention. For the disc drive of FIG. 1, communication system 148 is formed by internal logic 128, head gimbal assembly 112 and disc 106. Within communication system 148, an encoder 150 receives data samples 152 and produces a even and odd code words 153. Even and odd code words 153 are provided to parallel-to-serial converter 155 in a parallel manner such that all of the bits of a respective code word are provided to converter 155 at the same time. Parallel-to-serial converter 155 converts each parallel code word of even and odd code words 153 into a serial representation and concatenates the serial representations to produce a sequence of even and odd bits 154. The sequence of even and odd bits 154 meets several constraints discussed further below. Transmitter/channel precoder 156 receives the sequence of even and odd bits 154 and conditions the sequence so that it is optimized for the type of detector used to recover the signal from the channel. Transmitter/channel precoder 156 produces write signal 158, which is provided to channel 160.

Channel 160, which is comprised of a write head, a disc, and a read head when the communication system is a disc drive, conveys the encoded information from transmitter/precoder 156 to receiver/detector 162 as a read signal 164. Receiver/detector 162 amplifies and filters read signal 164 and recovers an encoded signal from the read signal using one of several known detection methods. For instance, receiver/detector 162 may use a Viterbi detector, Decision Feedback Equalization (DFE), Fixed-Delay Tree Search with Decision Feedback (FDTS/DF) or Reduced State Sequence detection (RSSE). After detecting and amplifying the signal from channel 160, receiver/detector 162 produces a recovered sequence of even and odd bits 165, which are provided to serial-to-parallel converter 163. The sequence of even and odd bits 165 is in a serial format at the input to serial-to-parallel converter 163. Serial-to-parallel converter 163 groups the bits into code words and converts the code words from a serial format to a parallel format. Serial-to-parallel converter 163 then outputs even and odd code words 166 in a parallel format. The even and odd code words 166 are provided to decoder 168. Decoder 168 uses the inverse of the coding rules used by encoder 150 and converts the even and odd code words 166 into recovered data stream 170.

Figure 3:
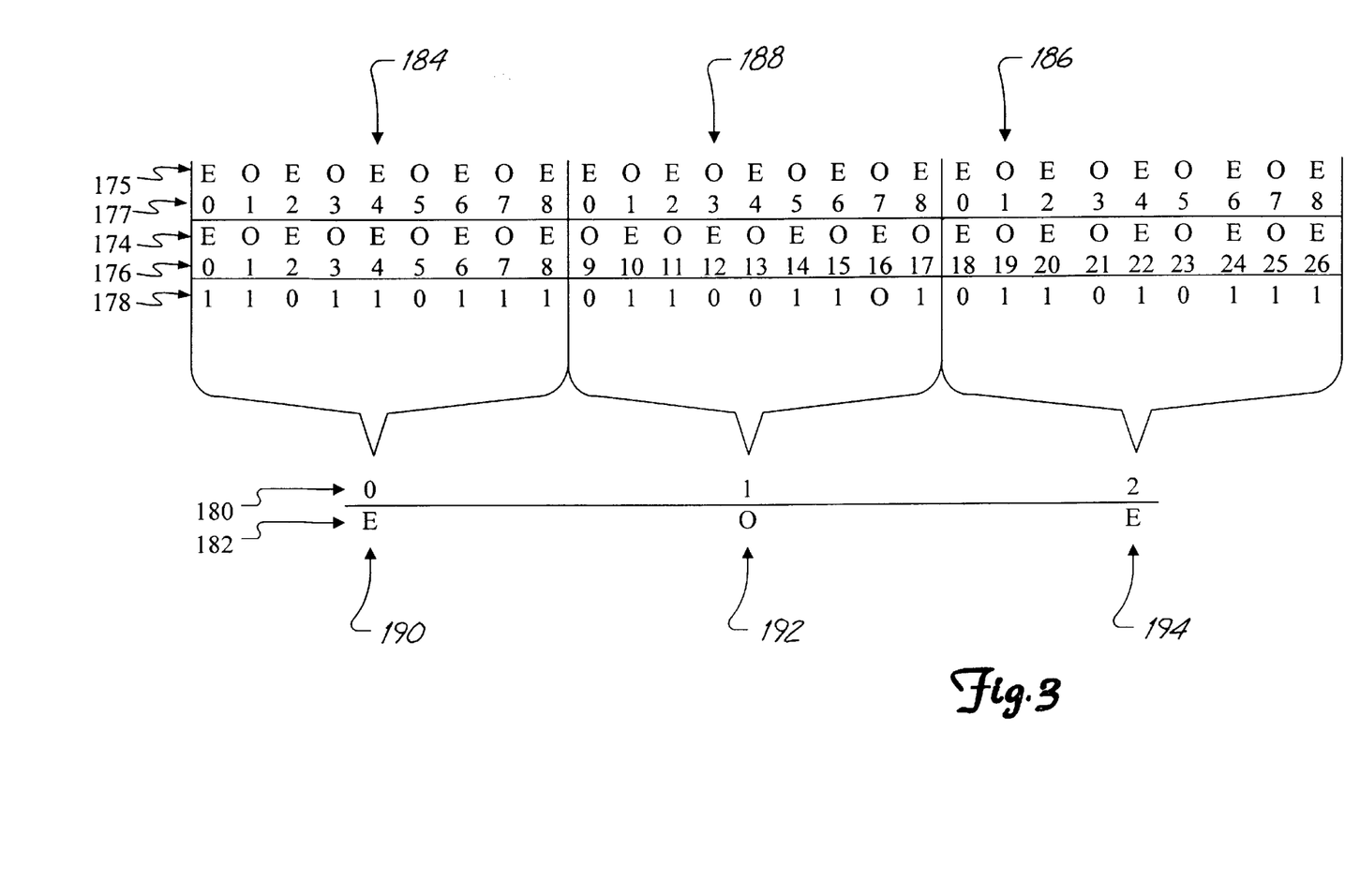
FIG. 3 is an organizational layout of an encoded stream showing the numbering and naming convention used with the present invention.

FIG. 3 shows an organizational layout for a code stream 178 of bits that is helpful in describing the numbering and naming system used in connection with the present invention. Code stream 178 is an example of the type of bit stream that can appear as the sequence of even and odd bits 154 or the sequence of even and odd bits 165 of FIG. 2.

In FIG. 3, the first bit in time is to the far left and later bits in time extend to the right. Above code stream 178 is number line 176, which assigns an integer to each bit in code stream 178 based on its overall location within the entire code stream. Under the present invention's numbering system, the first bit is numbered as bit zero, the second bit is bit one and so on. Above number line 176 is even/odd line 174, which provides an "E" designation for each even bit in code stream 178 and an "O" designation for each odd bit in code stream 178. The "E" and "O" designation is vertically aligned with its respective bit in code stream 178.

Above, even/odd line 174 is code-word-bit numbering line 177, which assigns an integer for each bit corresponding to the bit's location within a code word. In the embodiment of FIG. 3, each code word has 9 bit locations numbered 0 to 8. Above code-word-bit numbering line 177 is code word even/odd line 175, which provides an "E" designation for each even bit location in a code word and an "O" designation for each odd bit location in a code word.

Below code stream 178 is code-word count 180, which associates a number with each grouping of nine bits in code stream 178. Thus, the first nine bits form code word zero, the second nine bits form code word one, and the third nine bits form code word two. Vertically aligned with code-word count 180 is even/odd code word line 182 which provides an "E" designation for each even code word in code stream 178 and an "O" designation for each odd code word.

Code bits 184, 186, and 188 provide examples of the numbering and even/odd designations of the present invention. Code bit 184 is the fifth bit in code stream 178 and is assigned an overall numerical value of 4 in number line 176. Code bit 184 is also the fifth bit in the first code word, and thus is assigned a code-word-bit number of 4 in code-word-bit numbering line 177. Code bit 184 is designated as an even bit in both even/odd line 174 and code word even/odd line 175. Code bit 184 is part of the first code word 190, which is numbered code word zero in code word count 180 and which is designated as an even code word in even/odd code word line 182.

Bit 186 is the twentieth bit in code stream 178, has a numerical value of nineteen in the code stream and is considered an odd bit overall as shown in even/odd line 174. Although it is the twentieth bit overall, bit 186 is only the second bit in code word 194, and as such, has a code-word-bit number of 1 in code-word-bit numbering line 177. This means that it is an odd code bit within code word 194, as shown in code word even/odd line 175. Code word 194 has a numerical value of two and is considered an even code word.

Bit 188, which is the thirteenth bit in code stream 178 has an overall numerical value of twelve in numbering line 176 and is considered an even bit overall. Although bit 188 is the thirteenth bit overall, it is only the fourth bit in code word 192. As the fourth bit in code word 192, bit 188 has a code-word-bit number of 3 in code-word-bit numbering line 177, and is considered an odd bit within the code word. Thus, although bit 188 is an even bit overall, it is an odd bit within code word 192.

The code of the present invention provides a rate 8/9 code with location dependent maximum transition run constraints. In one embodiment of this code, transition runs beginning from odd bit locations within each code word are limited to two transitions ($L_1=2$) and transition runs starting from even bit locations are limited to three transitions ($L_2=3$).

With nine-bit code words using binary values for each bit, there are $2^9=512$ possible code words. After applying the MTR constraints described above, there are 356 code words that can be used to encode $2^8=256$ possible data words.

To ensure that invalid patterns do not occur when code words are concatenated, the 356 code words are mapped into a two-state system where an individual code word does not appear in more than one state but can appear twice within the same state. During encoding, the two-state coding system is in one of the two states, state S0 or state S1. Each data word has an associated code word and next state value in both state S0 and S1. The code word is the value produced by encoder 150 and the next state value determines what state the two-state system will be in when the next data word arrives. The assignment of code words to particular states and the movement between states is partially controlled by two state definitions. The first state definition is that all code words in state S1 begin with '0'. Because of this state definition, any code word may precede state S1 because the concatenation of any code word with a code word that begins with '0' will not violate the MTR constraint. The second state definition restricts code words that precede state S0 to those that end with '0'. Under this definition, any code word ending with a '0' may be used before state S0.

Using these state definitions, the mapping for an 8/9 rate MTR code with local $L_1=2$ and $L_2=3$ constraints can be derived. Such a mapping is shown in Table 1 below, where the nine-bit code words are represented by two hexadecimal values in the two right most locations and a single binary value in the left most location. The eight bit data words are represented by two hexadecimal values.

TABLE 1

| Data (Hex) | State 0 (S0) | | State 1 (S1) | |
|---|---|---|---|---|
| | Codeword | Next State | Codeword | Next State |
| 00 | 101 | S1 | 001 | S1 |
| 01 | 103 | S1 | 003 | S1 |
| 02 | 105 | S1 | 005 | S1 |
| 03 | 107 | S1 | 0B4 | S1 |
| 04 | 109 | S1 | 009 | S1 |
| 05 | 10B | S1 | 00B | S1 |
| 06 | 10D | S1 | 00D | S1 |
| 07 | 131 | S1 | 031 | S1 |
| 08 | 111 | S1 | 011 | S1 |
| 09 | 113 | S1 | 013 | S1 |
| 0A | 115 | S1 | 015 | S1 |
| 0B | 117 | S1 | 017 | S1 |
| 0C | 119 | S1 | 019 | S1 |
| 0D | 11B | S1 | 01B | S1 |
| 0E | 11D | S1 | 01D | S1 |
| 0F | 1B4 | S1 | 033 | S1 |
| 10 | 141 | S1 | 041 | S1 |
| 11 | 143 | S1 | 043 | S1 |
| 12 | 145 | S1 | 045 | S1 |
| 13 | 147 | S1 | 047 | S1 |
| 14 | 149 | S1 | 049 | S1 |
| 15 | 14B | S1 | 04B | S1 |
| 16 | 14D | S1 | 04D | S1 |
| 17 | 135 | S1 | 035 | S1 |
| 18 | 151 | S1 | 051 | S1 |
| 19 | 153 | S1 | 053 | S1 |
| 1A | 155 | S1 | 055 | S1 |
| 1B | 157 | S1 | 057 | S1 |
| 1C | 159 | S1 | 059 | S1 |
| 1D | 15B | S1 | 05B | S1 |
| 1E | 15D | S1 | 05D | S1 |
| 1F | 137 | S1 | 037 | S1 |
| 20 | 181 | S1 | 081 | S1 |
| 21 | 183 | S1 | 083 | S1 |
| 22 | 185 | S1 | 085 | S1 |
| 23 | 187 | S1 | 087 | S1 |
| 24 | 189 | S1 | 089 | S1 |
| 25 | 18B | S1 | 08B | S1 |
| 26 | 18D | S1 | 08D | S1 |
| 27 | 171 | S1 | 071 | S1 |
| 28 | 191 | S1 | 091 | S1 |
| 29 | 193 | S1 | 093 | S1 |

TABLE 1-continued

| Data (Hex) | State 0 (S0) | | State 1 (S1) | |
|---|---|---|---|---|
| | Codeword | Next State | Codeword | Next State |
| 2A | 195 | S1 | 095 | S1 |
| 2B | 197 | S1 | 097 | S1 |
| 2C | 199 | S1 | 099 | S1 |
| 2D | 19B | S1 | 09B | S1 |
| 2E | 19D | S1 | 09D | S1 |
| 2F | 173 | S1 | 073 | S1 |
| 30 | 1C1 | S1 | 0C1 | S1 |
| 31 | 1C3 | S1 | 0C3 | S1 |
| 32 | 1C5 | S1 | 0C5 | S1 |
| 33 | 1AD | S1 | 0C7 | S1 |
| 34 | 1C9 | S1 | 0C9 | S1 |
| 35 | 1CB | S1 | 0CB | S1 |
| 36 | 1CD | S1 | 0CD | S1 |
| 37 | 175 | S1 | 075 | S1 |
| 38 | 1D1 | S1 | 0D1 | S1 |
| 39 | 1D3 | S1 | 0D3 | S1 |
| 3A | 1D5 | S1 | 0D5 | S1 |
| 3B | 1D7 | S1 | 0D7 | S1 |
| 3C | 1D9 | S1 | 0D9 | S1 |
| 3D | 1DB | S1 | 0DB | S1 |
| 3E | 1DD | S1 | 0DD | S1 |
| 3F | 177 | S1 | 0AD | S1 |
| 40 | 121 | S1 | 021 | S1 |
| 41 | 123 | S1 | 023 | S1 |
| 42 | 125 | S1 | 035 | S1 |
| 43 | 127 | S1 | 027 | S1 |
| 44 | 129 | S1 | 029 | S1 |
| 45 | 12B | S1 | 02B | S1 |
| 46 | 12D | S1 | 02D | S1 |
| 47 | 1B1 | S1 | 0B1 | S1 |
| 48 | 161 | S1 | 061 | S1 |
| 49 | 163 | S1 | 063 | S1 |
| 4A | 165 | S1 | 065 | S1 |
| 4B | 167 | S1 | 067 | S1 |
| 4C | 169 | S1 | 069 | S1 |
| 4D | 16B | S1 | 06B | S1 |
| 4E | 16D | S1 | 06D | S1 |
| 4F | 1B3 | S1 | 0B3 | S1 |
| 50 | 120 | S1 | 020 | S1 |
| 51 | 122 | S1 | 022 | S1 |
| 52 | 124 | S1 | 024 | S1 |
| 53 | 126 | S1 | 026 | S1 |
| 54 | 128 | S1 | 028 | S1 |
| 55 | 12A | S1 | 02A | S1 |
| 56 | 12C | S1 | 02C | S1 |
| 57 | 1B5 | S1 | 0B5 | S1 |
| 58 | 160 | S1 | 060 | S1 |
| 59 | 162 | S1 | 062 | S1 |
| 5A | 164 | S1 | 064 | S1 |
| 5B | 166 | S1 | 0B6 | S1 |
| 5C | 168 | S1 | 068 | S1 |
| 5D | 16A | S1 | 06A | S1 |
| 5E | 16C | S1 | 06C | S1 |
| 5F | 1B7 | S1 | 0B7 | S1 |
| 60 | 1A0 | S1 | 0A0 | S1 |
| 61 | 1A2 | S1 | 0A2 | S1 |
| 62 | 1A4 | S1 | 0A4 | S1 |
| 63 | 1A6 | S1 | 0A6 | S1 |
| 64 | 1A8 | S1 | 0A8 | S1 |
| 65 | 1AA | S1 | 0AA | S1 |
| 66 | 1AC | S1 | 0AC | S1 |
| 67 | 1B2 | S1 | 0B2 | S1 |
| 68 | 1A0 | S0 | 0A0 | S0 |
| 69 | 1A2 | S0 | 0A2 | S0 |
| 6A | 1A4 | S0 | 0A4 | S0 |
| 6B | 1A6 | S0 | 0A6 | S0 |
| 6C | 1A8 | S0 | 0A8 | S0 |
| 6D | 1AA | S0 | 0AA | S0 |
| 6E | 1AC | S0 | 0AC | S0 |
| 6F | 1B2 | S0 | 0B2 | S0 |
| 70 | 120 | S0 | 020 | S0 |
| 71 | 122 | S0 | 022 | S0 |
| 72 | 124 | S0 | 024 | S0 |
| 73 | 126 | S0 | 026 | S0 |

TABLE 1-continued

| Data (Hex) | State 0 (S0) Codeword | State 0 (S0) Next State | State 1 (S1) Codeword | State 1 (S1) Next State |
|---|---|---|---|---|
| 74 | 128 | S0 | 028 | S0 |
| 75 | 12A | S0 | 02A | S0 |
| 76 | 12C | S0 | 02C | S0 |
| 77 | 1B4 | S0 | 0B4 | S0 |
| 78 | 160 | S0 | 060 | S0 |
| 79 | 162 | S0 | 062 | S0 |
| 7A | 164 | S0 | 064 | S0 |
| 7B | 166 | S0 | 066 | S0 |
| 7C | 168 | S0 | 068 | S0 |
| 7D | 16A | S0 | 06A | S0 |
| 7E | 16C | S0 | 06C | S0 |
| 7F | 1B6 | S0 | 0B6 | S0 |
| 80 | 1B0 | S1 | 0B0 | S1 |
| 81 | 102 | S1 | 002 | S1 |
| 82 | 104 | S1 | 004 | S1 |
| 83 | 106 | S1 | 006 | S1 |
| 84 | 108 | S1 | 008 | S1 |
| 85 | 10A | S1 | 00A | S1 |
| 86 | 10C | S1 | 00C | S1 |
| 87 | 130 | S1 | 030 | S1 |
| 88 | 110 | S1 | 010 | S1 |
| 89 | 112 | S1 | 012 | S1 |
| 8A | 114 | S1 | 014 | S1 |
| 8B | 116 | S1 | 016 | S1 |
| 8C | 118 | S1 | 018 | S1 |
| 8D | 11A | S1 | 01A | S1 |
| 8E | 11C | S1 | 0A1 | S1 |
| 8F | 132 | S1 | 032 | S1 |
| 90 | 140 | S1 | 040 | S1 |
| 91 | 142 | S1 | 042 | S1 |
| 92 | 144 | S1 | 044 | S1 |
| 93 | 146 | S1 | 046 | S1 |
| 94 | 148 | S1 | 048 | S1 |
| 95 | 14A | S1 | 04A | S1 |
| 96 | 14C | S1 | 04C | S1 |
| 97 | 134 | S1 | 034 | S1 |
| 98 | 150 | S1 | 050 | S1 |
| 99 | 152 | S1 | 052 | S1 |
| 9A | 154 | S1 | 054 | S1 |
| 9B | 156 | S1 | 056 | S1 |
| 9C | 158 | S1 | 058 | S1 |
| 9D | 15A | S1 | 05A | S1 |
| 9E | 15C | S1 | 05C | S1 |
| 9F | 136 | S1 | 036 | S1 |
| A0 | 180 | S1 | 080 | S1 |
| A1 | 182 | S1 | 082 | S1 |
| A2 | 184 | S1 | 084 | S1 |
| A3 | 186 | S1 | 086 | S1 |
| A4 | 188 | S1 | 088 | S1 |
| A5 | 18A | S1 | 08A | S1 |
| A6 | 18C | S1 | 08C | S1 |
| A7 | 170 | S1 | 0A5 | S1 |
| A8 | 190 | S1 | 090 | S1 |
| A9 | 192 | S1 | 092 | S1 |
| AA | 194 | S1 | 094 | S1 |
| AB | 196 | S1 | 096 | S1 |
| AC | 198 | S1 | 098 | S1 |
| AD | 19A | S1 | 09A | S1 |
| AE | 19C | S1 | 09C | S1 |
| AF | 172 | S1 | 072 | S1 |
| B0 | 1A1 | S1 | 0C0 | S1 |
| B1 | 1C2 | S1 | 0C2 | S1 |
| B2 | 1C4 | S1 | 0C4 | S1 |
| B3 | 1C6 | S1 | 0C6 | S1 |
| B4 | 1C8 | S1 | 0C8 | S1 |
| B5 | 1CA | S1 | 0CA | S1 |
| B6 | 1CC | S1 | 0A9 | S1 |
| B7 | 174 | S1 | 074 | S1 |
| B8 | 1D0 | S1 | 0D0 | S1 |
| B9 | 1D2 | S1 | 0D2 | S1 |
| BA | 1D4 | S1 | 0D4 | S1 |
| BB | 1D6 | S1 | 0D6 | S1 |
| BC | 1D8 | S1 | 0D8 | S1 |
| BD | 1DA | S1 | 0DA | S1 |
| BE | 1A5 | S1 | 0DC | S1 |
| BF | 176 | S1 | 076 | S1 |
| C0 | 1B0 | S0 | 0B0 | S0 |
| C1 | 102 | S0 | 002 | S0 |
| C2 | 104 | S0 | 004 | S0 |
| C3 | 106 | S0 | 006 | S0 |
| C4 | 108 | S0 | 008 | S0 |
| C5 | 10A | S0 | 00A | S0 |
| C6 | 10C | S0 | 00C | S0 |
| C7 | 130 | S0 | 030 | S0 |
| C8 | 110 | S0 | 010 | S0 |
| C9 | 112 | S0 | 012 | S0 |
| CA | 114 | S0 | 014 | S0 |
| CB | 116 | S0 | 016 | S0 |
| CC | 118 | S0 | 018 | S0 |
| CD | 11A | S0 | 01A | S0 |
| CE | 11C | S0 | 0A3 | S1 |
| CF | 132 | S0 | 032 | S0 |
| D0 | 140 | S0 | 040 | S0 |
| D1 | 142 | S0 | 042 | S0 |
| D2 | 144 | S0 | 044 | S0 |
| D3 | 146 | S0 | 046 | S0 |
| D4 | 148 | S0 | 048 | S0 |
| D5 | 14A | S0 | 04A | S0 |
| D6 | 14C | S0 | 04C | S0 |
| D7 | 134 | S0 | 034 | S0 |
| D8 | 150 | S0 | 050 | S0 |
| D9 | 152 | S0 | 052 | S0 |
| DA | 154 | S0 | 054 | S0 |
| DB | 156 | S0 | 056 | S0 |
| DC | 158 | S0 | 058 | S0 |
| DD | 15A | S0 | 05A | S0 |
| DE | 15C | S0 | 05C | S0 |
| DF | 136 | S0 | 036 | S0 |
| E0 | 180 | S0 | 080 | S0 |
| E1 | 182 | S0 | 082 | S0 |
| E2 | 184 | S0 | 084 | S0 |
| E3 | 186 | S0 | 086 | S0 |
| E4 | 188 | S0 | 088 | S0 |
| E5 | 18A | S0 | 08A | S0 |
| E6 | 18C | S0 | 08C | S0 |
| E7 | 170 | S0 | 0A7 | S1 |
| E8 | 190 | S0 | 090 | S0 |
| E9 | 192 | S0 | 092 | S0 |
| EA | 194 | S0 | 094 | S0 |
| EB | 196 | S0 | 096 | S0 |
| EC | 198 | S0 | 098 | S0 |
| ED | 19A | S0 | 09A | S0 |
| EE | 19C | S0 | 09C | S0 |
| EF | 172 | S0 | 072 | S0 |
| F0 | 1A3 | S1 | 0C0 | S0 |
| F1 | 1C2 | S0 | 0C2 | S0 |
| F2 | 1C4 | S0 | 0C4 | S0 |
| F3 | 1C6 | S0 | 0C6 | S0 |
| F4 | 1C8 | S0 | 0C8 | S0 |
| F5 | 1CA | S0 | 0CA | S0 |
| F6 | 1CC | S0 | 0AB | S1 |
| F7 | 174 | S0 | 074 | S0 |
| F8 | 1D0 | S0 | 0D0 | S0 |
| F9 | 1D2 | S0 | 0D2 | S0 |
| FA | 1D4 | S0 | 0D4 | S0 |
| FB | 1D6 | S0 | 0D6 | S0 |
| FC | 1D8 | S0 | 0D8 | S0 |
| FD | 1DA | S0 | 0DA | S0 |
| FE | 1A7 | S1 | 0DC | S0 |
| FF | 176 | S0 | 076 | S0 |

Because a single code word can occur twice within a given state for two different data words, the decoder must determine the state of the next code word to decode the present code word. For example, if code word "120" is received, and the decoder is in state S0, the code word represent either data word "50" or data word "70". The decoder must determine which state the next code word belongs to before it can determine what data word the code word "120" represents. If the next code word is from state S0, "70" will be the decoded output, otherwise "50" will be the decoded output.

In order for a detector to identify code words that violate the MTR constraint and thus contain an error, the detector must keep track of whether it has an odd numbered code word or an even numbered code word. Since there are nine bits in each code words, if the decoder did not keep track of even and odd code words but merely kept track of whether it had an even or odd bit overall, the tenth received bit would considered an odd bit overall. However, since the tenth received bit is the first bit of the second code word, it is an even bit within that code word. Therefore, in order to properly track even and odd locations within code words, the detector must be complex enough to keep track of even and odd code words in addition to keeping track of even and odd bits within code words.

To reduce this complexity, the present invention provides an alternate rate 8/9 code word mapping. In this alternate mapping, even code words are constrained in the same manner as described above such that transition runs beginning from odd bit locations are limited to two transitions ($L_1=2$) and transition runs beginning from even bit locations are limited to three transitions ($L_2=3$). However, odd code words under this alternate mapping have different localized MTR constraints. Specifically, for odd code words, transition runs beginning from odd bit locations are limited to three transitions ($L_1=3$) and transition runs beginning from even bit locations are limited to two transitions ($L_2=2$). By interleaving code words that use these two different sets of constraints, an MTR code is formed that provides universal MTR constraints of two for odd bit locations and three for even bit locations counting from the beginning of the code stream. Thus, the decoder does not have to keep track of whether the current code word is in an even temporal location or an odd temporal location. It only has to keep track of the overall temporal location of the bits.

Of the possible 512 nine-bit code words, 317 meet the $L_1=3$ and $L_2=2$ MTR constraint. To ensure proper concatenation, the 317 code words that meet this constraint and the 356 code words that meet the $L_1=2$ and $L_2=3$ MTR constraint are divided into four states each, forming a total of eight states. The four states for the code words having an MTR constraint of three for even code words ($L_2=3$) and two for odd code words ($L_1=2$) are denoted as states S0, S2, S4 and S6. The four states for the code words satisfying the MTR constraint of three for odd positions ($L_1=3$) and two for even positions ($L_2=2$) are denoted as states S1, S2, S5 and S7.

The four states for one group of code words shares common state definitions with the four states for the other group of code words. Code words in states S0 or S1 can begin with any two bits including "11" so code words preceding state S0 or state S1 must end with "0". The code words in state S2 or state S3 may only begin with "10" so code words preceding state S2 or state S3 must end with "00" or "01". Code words in states S4, S5, S6, and S7 only begin with "0" so any code word may proceed these states.

Given these state definitions, the 356 code words that satisfy the MTR constraint of three for temporally even bit positions and two for temporally odd bit positions are divided between states S0, S2, S4, and S6. Similarly, the 317 code words that satisfy the MTR constraint of three for temporally odd bit positions and two for temporally even bit positions are divided between states S1, S3, S5, and S7. Note that many code words satisfy both constraints and thus are found in more than one state. However, code words found in even numbered states such as S0, S2, S4, or S6 are not found in another even numbered state. Similarly, a single code word does not appear in two different odd numbered states (S1, S3, S5, or S7). The code words found in an even numbered state, however, can be found in an odd numbered state. In addition, code words may be repeated within a state.

To realize the universal MTR constraint of two for odd bit positions and three for even bit positions over the entire encoded signal, the next state for any even numbered state, states S0, S2, S4 or S6, must be an odd numbered state, states S1, S3, S5, or S7. Similarly, the next state for any odd numbered state, must be an even numbered state.

An encoding/decoding table for a code based on these eight states is shown in Table 2 below. In Table 2, "NS" in the headers indicates the next state for the encoder/decoder. The code words of these tables are described in a modified hexadecimal format where the two right-most character locations are described by hexadecimal characters and the left-most character location is described by a binary value.

TABLE 2

| Data | State 0 (S0) Code | NS | State 1 (S1) Code | NS | State 2 (S2) Code | NS | State 3 (S3) Code | NS | State 4 (S4) Code | NS | State 5 (S5) Code | NS | State 6 (S6) Code | NS | State 7 (S7) Code | NS |
|---|---|---|---|---|---|---|---|---|---|---|---|---|---|---|---|---|
| 00 | 1C2 | S1 | 1AE | S0 | 100 | S1 | 100 | S0 | 028 | S1 | 028 | S0 | 00C | S1 | 00C | S0 |
| 01 | 182 | S1 | 182 | S0 | 102 | S1 | 102 | S0 | 02A | S1 | 02A | S0 | 002 | S1 | 002 | S0 |
| 02 | 184 | S1 | 184 | S0 | 104 | S1 | 104 | S0 | 02C | S1 | 02C | S0 | 004 | S1 | 004 | S0 |
| 03 | 186 | S1 | 186 | S0 | 106 | S1 | 106 | S0 | 04C | S1 | 04C | S0 | 006 | S1 | 006 | S0 |
| 04 | 188 | S1 | 188 | S0 | 108 | S1 | 108 | S0 | 0A8 | S1 | 0A8 | S0 | 008 | S1 | 008 | S0 |
| 05 | 18A | S1 | 18A | S0 | 10A | S1 | 10A | S0 | 0AA | S1 | 0AA | S0 | 00A | S1 | 00A | S0 |
| 06 | 18C | S1 | 18C | S0 | 10C | S1 | 10C | S0 | 0AC | S1 | 0AC | S0 | 020 | S1 | 020 | S0 |
| 07 | 190 | S1 | 190 | S0 | 110 | S1 | 110 | S0 | 08C | S1 | 08C | S0 | 022 | S1 | 022 | S0 |
| 08 | 192 | S1 | 192 | S0 | 112 | S1 | 112 | S0 | 060 | S1 | 060 | S0 | 010 | S1 | 010 | S0 |
| 09 | 194 | S1 | 194 | S0 | 114 | S1 | 114 | S0 | 062 | S1 | 062 | S0 | 012 | S1 | 012 | S0 |
| 0A | 196 | S1 | 196 | S0 | 116 | S1 | 116 | S0 | 064 | S1 | 064 | S0 | 014 | S1 | 014 | S0 |
| 0B | 198 | S1 | 198 | S0 | 118 | S1 | 118 | S0 | 068 | S1 | 068 | S0 | 016 | S1 | 016 | S0 |
| 0C | 19A | S1 | 19A | S0 | 11A | S1 | 11A | S0 | 06A | S1 | 06A | S0 | 018 | S1 | 018 | S0 |
| 0D | 1A0 | S1 | 1A0 | S0 | 120 | S1 | 120 | S0 | 06C | S1 | 06C | S0 | 01A | S1 | 01A | S0 |
| 0E | 1A2 | S1 | 1A2 | S0 | 122 | S1 | 122 | S0 | 05C | S1 | 02E | S0 | 024 | S1 | 024 | S0 |
| 0F | 1A4 | S1 | 1A4 | S0 | 124 | S1 | 124 | S0 | 072 | S1 | 03A | S0 | 026 | S1 | 026 | S0 |
| 10 | 1A6 | S1 | 1A6 | S0 | 126 | S1 | 126 | S0 | 074 | S1 | 04E | S0 | 040 | S1 | 040 | S0 |

TABLE 2-continued

| | State 0 (S0) | | State 1 (S1) | | State 2 (S2) | | State 3 (S3) | | State 4 (S4) | | State 5 (S5) | | State 6 (S6) | | State 7 (S7) | |
|---|---|---|---|---|---|---|---|---|---|---|---|---|---|---|---|---|
| Data | Code | NS | Code | NS | Code | NS | Code | NS | Code | NS | Code | NS | Code | NS | Code | NS |
| 11 | 1A8 | S1 | 1A8 | S0 | 128 | S1 | 128 | S0 | 076 | S1 | 06E | S0 | 042 | S1 | 042 | S0 |
| 12 | 1AA | S1 | 1AA | S0 | 12A | S1 | 12A | S0 | 09C | S1 | 08E | S0 | 044 | S1 | 044 | S0 |
| 13 | 1AC | S1 | 1AC | S0 | 12C | S1 | 12C | S0 | 0DC | S1 | 0AE | S0 | 046 | S1 | 046 | S0 |
| 14 | 1B0 | S1 | 1B0 | S0 | 130 | S1 | 130 | S0 | 075 | S1 | 0B8 | S0 | 048 | S1 | 048 | S0 |
| 15 | 1B2 | S1 | 1B2 | S0 | 132 | S1 | 132 | S0 | 075 | S3 | 0BA | S0 | 04A | S1 | 04A | S0 |
| 16 | 1B4 | S1 | 1B4 | S0 | 134 | S1 | 134 | S0 | 09D | S3 | 0CE | S0 | 030 | S1 | 030 | S0 |
| 17 | 1B6 | S1 | 1B6 | S0 | 136 | S1 | 136 | S0 | 073 | S5 | 0E2 | S0 | 032 | S1 | 032 | S0 |
| 18 | 19D | S3 | 039 | S2 | 140 | S1 | 140 | S0 | 075 | S5 | 0E4 | S0 | 050 | S1 | 050 | S0 |
| 19 | 1C1 | S3 | 0B9 | S2 | 142 | S1 | 142 | S0 | 09D | S5 | 0E6 | S0 | 052 | S1 | 052 | S0 |
| 1A | 1C5 | S3 | 0E1 | S2 | 144 | S1 | 144 | S0 | 073 | S7 | 0E8 | S0 | 054 | S1 | 054 | S0 |
| 1B | 1C9 | S3 | 0E5 | S2 | 146 | S1 | 146 | S0 | 075 | S7 | 0EA | S0 | 056 | S1 | 056 | S0 |
| 1C | 1CD | S3 | 0E9 | S2 | 148 | S1 | 148 | S0 | 09D | S7 | 0EC | S0 | 058 | S1 | 058 | S0 |
| 1D | 1D1 | S3 | 0ED | S2 | 14A | S1 | 14A | S0 | 025 | S5 | 025 | S4 | 05A | S1 | 05A | S0 |
| 1E | 1D5 | S3 | 139 | S2 | 14C | S1 | 14C | S0 | 029 | S5 | 029 | S4 | 034 | S1 | 034 | S0 |
| 1F | 1D9 | S3 | 1B9 | S2 | 150 | S1 | 150 | S0 | 02D | S5 | 02D | S4 | 036 | S1 | 036 | S0 |
| 20 | 19D | S5 | 039 | S4 | 152 | S1 | 152 | S0 | 031 | S5 | 031 | S4 | 080 | S1 | 080 | S0 |
| 21 | 1C1 | S5 | 0B9 | S4 | 154 | S1 | 154 | S0 | 035 | S5 | 035 | S4 | 082 | S1 | 082 | S0 |
| 22 | 1C5 | S5 | 0E1 | S4 | 156 | S1 | 156 | S0 | 041 | S5 | 041 | S4 | 084 | S1 | 084 | S0 |
| 23 | 1C9 | S5 | 0E5 | S4 | 158 | S1 | 158 | S0 | 045 | S5 | 045 | S4 | 086 | S1 | 086 | S0 |
| 24 | 1CD | S5 | 0E9 | S4 | 15A | S1 | 15A | S0 | 049 | S5 | 049 | S4 | 088 | S1 | 088 | S0 |
| 25 | 1D1 | S5 | 0ED | S4 | 160 | S1 | 160 | S0 | 04D | S5 | 04D | S4 | 08A | S1 | 08A | S0 |
| 26 | 1D5 | S5 | 139 | S4 | 162 | S1 | 162 | S0 | 051 | S5 | 051 | S4 | 0A0 | S1 | 0A0 | S0 |
| 27 | 1D9 | S5 | 1B9 | S4 | 164 | S1 | 164 | S0 | 055 | S5 | 055 | S4 | 0A2 | S1 | 0A2 | S0 |
| 28 | 19D | S7 | 039 | S6 | 166 | S1 | 166 | 50 | 059 | S5 | 059 | S4 | 090 | S1 | 090 | S0 |
| 29 | 1C1 | S7 | 0B9 | S6 | 168 | S1 | 168 | S0 | 061 | S5 | 061 | S4 | 092 | S1 | 092 | S0 |
| 2A | 1C5 | S7 | 0E1 | S6 | 16A | S1 | 16A | S0 | 065 | S5 | 065 | S4 | 094 | S1 | 094 | S0 |
| 2B | 1C9 | S7 | 0E5 | S6 | 16C | S1 | 16C | S0 | 069 | S5 | 069 | S4 | 096 | S1 | 096 | S0 |
| 2C | 1CD | S7 | 0E9 | S6 | 15C | S1 | 13A | S0 | 06D | S5 | 06D | S4 | 098 | S1 | 098 | S0 |
| 2D | 1D1 | S7 | 0ED | S6 | 15C | S3 | 13A | S2 | 081 | S5 | 081 | S4 | 09A | S1 | 09A | S0 |
| 2E | 1D5 | S7 | 139 | S6 | 15C | S5 | 13A | S4 | 085 | S5 | 085 | S4 | 0A4 | S1 | 0A4 | S0 |
| 2F | 1D9 | S7 | 1B9 | S6 | 15C | S7 | 13A | S6 | 089 | S5 | 089 | S4 | 0A6 | S1 | 0A6 | S0 |
| 30 | 183 | S5 | 183 | S4 | 170 | S1 | 10E | S0 | 059 | S7 | 059 | S6 | 0C0 | S1 | 0C0 | S0 |
| 31 | 18B | S5 | 18B | S4 | 172 | S1 | 12E | S0 | 061 | S7 | 061 | S6 | 0C2 | S1 | 0C2 | S0 |
| 32 | 193 | S5 | 193 | S4 | 174 | S1 | 14E | S0 | 065 | S7 | 065 | S6 | 0C4 | S1 | 0C4 | S0 |
| 33 | 19B | S5 | 19B | 94 | 176 | S1 | 16E | S0 | 069 | S7 | 069 | S6 | 0C6 | S1 | 0C6 | S0 |
| 34 | 1A3 | S5 | 1A3 | S4 | 170 | S3 | 10E | S2 | 06D | S7 | 06D | S6 | 0C8 | S1 | 0C8 | S0 |
| 35 | 1AB | S5 | 1AB | S4 | 172 | S3 | 12E | S2 | 081 | S7 | 081 | S6 | 0CA | S1 | 0CA | S0 |
| 36 | 1B3 | S5 | 1B3 | S4 | 174 | S3 | 14E | S2 | 085 | S7 | 085 | S6 | 0B0 | S1 | 0B0 | S0 |
| 37 | 1DB | S5 | 1BB | S4 | 176 | S3 | 16E | S2 | 089 | S7 | 089 | S6 | 0B2 | S1 | 0B2 | S0 |
| 38 | 183 | S7 | 183 | S6 | 170 | S5 | 10E | S4 | 025 | S7 | 025 | S6 | 0D0 | S1 | 0D0 | S0 |
| 39 | 18B | S7 | 18B | S6 | 172 | S5 | 12E | S4 | 029 | S7 | 029 | S6 | 0D2 | S1 | 0D2 | S0 |
| 3A | 193 | S7 | 193 | S6 | 174 | S5 | 14E | S4 | 02D | S7 | 02D | S6 | 0D4 | S1 | 0D4 | S0 |
| 3B | 19B | S7 | 19B | S6 | 176 | S5 | 16E | S4 | 0DD | S3 | 0E3 | S2 | 0D6 | S1 | 0D6 | S0 |
| 3C | 1A3 | S7 | 1A3 | S6 | 170 | S7 | 10E | S6 | 0DD | S5 | 0E3 | S4 | 0D8 | S1 | 0D8 | S0 |
| 3D | 1AB | S7 | 1AB | S6 | 172 | S7 | 12E | S6 | 08D | S3 | 08D | S2 | 0DA | S1 | 0DA | S0 |
| 3E | 1B3 | S7 | 1B3 | S6 | 174 | S7 | 14E | S6 | 08D | S5 | 08D | S4 | 0B4 | S1 | 0B4 | S0 |
| 3F | 1DB | S7 | 1BB | S6 | 176 | S7 | 16E | S6 | 08D | S7 | 08D | S6 | 0B6 | S1 | 0B6 | S0 |
| 40 | 1C2 | S3 | 1AE | S2 | 100 | S3 | 100 | S2 | 028 | S3 | 028 | S2 | 00C | S3 | 00C | S2 |
| 41 | 182 | S3 | 182 | S2 | 102 | S3 | 102 | S2 | 02A | S3 | 02A | S2 | 002 | S3 | 002 | S2 |
| 42 | 184 | S3 | 184 | S2 | 104 | S3 | 104 | S2 | 02C | S3 | 02C | S2 | 004 | S3 | 004 | S2 |
| 43 | 186 | S3 | 186 | S2 | 106 | S3 | 106 | S2 | 04C | S3 | 04C | S2 | 006 | S3 | 006 | S2 |
| 44 | 188 | S3 | 188 | S2 | 108 | S3 | 108 | S2 | 0A8 | S3 | 0A8 | S2 | 008 | S3 | 008 | S2 |
| 45 | 18A | S3 | 18A | S2 | 10A | S3 | 10A | S2 | 0AA | S3 | 0AA | S2 | 00A | S3 | 00A | S2 |
| 46 | 18C | S3 | 18C | S2 | 10C | S3 | 10C | S2 | 0AC | S3 | 0AC | S2 | 020 | S3 | 020 | S2 |
| 47 | 190 | S3 | 190 | S2 | 110 | S3 | 110 | S2 | 08C | S3 | 08C | S2 | 022 | S3 | 022 | S2 |
| 48 | 192 | S3 | 192 | S2 | 112 | S3 | 112 | S2 | 060 | S3 | 060 | S2 | 010 | S3 | 010 | S2 |
| 49 | 194 | S3 | 194 | S2 | 114 | S3 | 114 | S2 | 062 | S3 | 062 | S2 | 012 | S3 | 012 | S2 |
| 4A | 196 | S3 | 196 | S2 | 116 | S3 | 116 | S2 | 064 | S3 | 064 | S2 | 014 | S3 | 014 | S2 |
| 4B | 198 | S3 | 198 | S2 | 118 | S3 | 118 | S2 | 068 | S3 | 068 | S2 | 016 | S3 | 016 | S2 |
| 4C | 19A | S3 | 19A | S2 | 11A | S3 | 11A | S2 | 06A | S3 | 06A | S2 | 018 | S3 | 018 | S2 |
| 4D | 1A0 | S3 | 1A0 | S2 | 120 | S3 | 120 | S2 | 06C | S3 | 06C | S2 | 01A | S3 | 01A | S2 |
| 4E | 1A2 | S3 | 1A2 | S2 | 122 | S3 | 122 | S2 | 05C | S3 | 02E | S2 | 024 | S3 | 024 | S2 |
| 4F | 1A4 | S3 | 1A4 | S2 | 124 | S3 | 124 | S2 | 072 | S3 | 03A | S2 | 026 | S3 | 026 | S2 |
| 50 | 1A6 | S3 | 1A6 | S2 | 126 | S3 | 126 | S2 | 074 | S3 | 04E | S2 | 040 | S3 | 040 | S2 |
| 51 | 1A8 | S3 | 1A8 | S2 | 128 | S3 | 128 | S2 | 076 | S3 | 06E | S2 | 042 | S3 | 042 | S2 |
| 52 | 1AA | S3 | 1AA | S2 | 12A | S3 | 12A | S2 | 09C | S3 | 08E | S2 | 044 | S3 | 044 | S2 |
| 53 | 1AC | S3 | 1AC | S2 | 12C | S3 | 12C | S2 | 0DC | S3 | 0AE | S2 | 046 | S3 | 046 | S2 |
| 54 | 1B0 | S3 | 1B0 | S2 | 130 | S3 | 130 | S2 | 01D | S3 | 0B8 | S2 | 048 | S3 | 048 | S2 |
| 55 | 1B2 | S3 | 1B2 | S2 | 132 | S3 | 132 | S2 | 05D | S3 | 0BA | S2 | 04A | S3 | 04A | S2 |
| 56 | 1B4 | S3 | 1B4 | S2 | 134 | S3 | 134 | S2 | 071 | S3 | 0CE | S2 | 030 | S3 | 030 | S2 |
| 57 | 1B6 | S3 | 1B6 | S2 | 136 | S3 | 136 | S2 | 01D | S5 | 0E2 | S2 | 032 | S3 | 032 | S2 |
| 58 | 181 | S3 | 181 | S2 | 140 | S3 | 140 | S2 | 05D | S5 | 0E4 | S2 | 050 | S3 | 050 | S2 |
| 59 | 185 | S3 | 185 | S2 | 142 | S3 | 142 | S2 | 071 | S5 | 0E6 | S2 | 052 | S3 | 052 | S2 |
| 5A | 189 | S3 | 189 | S2 | 144 | S3 | 144 | S2 | 01D | S7 | 0E8 | S2 | 054 | S3 | 054 | S2 |

TABLE 2-continued

| | State 0 (S0) | | State 1 (S1) | | State 2 (S2) | | State 3 (S3) | | State 4 (S4) | | State 5 (S5) | | State 6 (S6) | | State 7 (S7) | |
|---|---|---|---|---|---|---|---|---|---|---|---|---|---|---|---|---|
| Data | Code | NS | Code | NS | Code | NS | Code | NS | Code | NS | Code | NS | Code | NS | Code | NS |
| 5B | 18D | S3 | 18D | S2 | 146 | S3 | 146 | S2 | 05D | S7 | 0EA | S2 | 056 | S3 | 056 | S2 |
| 5C | 191 | S3 | 191 | S2 | 148 | S3 | 148 | S2 | 071 | S7 | 0EC | S2 | 058 | S3 | 058 | S2 |
| 5D | 195 | S3 | 195 | S2 | 14A | S3 | 14A | S2 | 025 | S3 | 025 | S2 | 05A | S3 | 05A | S2 |
| 5E | 1A1 | S3 | 1A1 | S2 | 14C | S3 | 14C | S2 | 029 | S3 | 029 | S2 | 034 | S3 | 034 | S2 |
| 5F | 1A5 | S3 | 1A5 | S2 | 150 | S3 | 150 | S2 | 02D | S3 | 02D | S2 | 036 | S3 | 036 | S2 |
| 60 | 1A9 | S3 | 1A9 | S2 | 152 | S3 | 152 | S2 | 031 | S3 | 031 | S2 | 080 | S3 | 080 | S2 |
| 61 | 1AD | S3 | 1AD | S2 | 154 | S3 | 154 | S2 | 035 | S3 | 035 | S2 | 082 | S3 | 082 | S2 |
| 62 | 1B1 | S3 | 1B1 | S2 | 156 | S3 | 156 | S2 | 041 | S3 | 041 | S2 | 084 | S3 | 084 | S2 |
| 63 | 1B5 | S3 | 1B5 | S2 | 158 | S3 | 158 | S2 | 045 | S3 | 045 | S2 | 086 | S3 | 086 | S2 |
| 64 | 11D | S3 | 103 | S2 | 15A | S3 | 15A | S2 | 049 | S3 | 049 | S2 | 088 | S3 | 088 | S2 |
| 65 | 15D | S3 | 10B | S2 | 160 | S3 | 160 | S2 | 04D | S3 | 04D | S2 | 08A | S3 | 08A | S2 |
| 66 | 171 | S3 | 113 | S2 | 162 | S3 | 162 | S2 | 051 | S3 | 051 | S2 | 0A0 | S3 | 0A0 | S2 |
| 67 | 173 | S3 | 11B | S2 | 164 | S3 | 164 | S2 | 055 | S3 | 055 | S2 | 0A2 | S3 | 0A2 | S2 |
| 68 | 11D | S5 | 123 | S2 | 166 | S3 | 166 | S2 | 059 | S3 | 059 | S2 | 090 | S3 | 090 | S2 |
| 69 | 15D | S5 | 12B | S2 | 168 | S3 | 168 | S2 | 061 | S3 | 061 | S2 | 092 | S3 | 092 | S2 |
| 6A | 171 | S5 | 143 | S2 | 16A | S3 | 16A | S2 | 065 | S3 | 065 | S2 | 094 | S3 | 094 | S2 |
| 6B | 173 | S5 | 14B | S2 | 16C | S3 | 16C | S2 | 069 | S3 | 069 | S2 | 096 | S3 | 096 | S2 |
| 6C | 11D | S7 | 153 | S2 | 111 | S3 | 111 | S2 | 06D | S3 | 06D | S2 | 098 | S3 | 098 | S2 |
| 6D | 15D | S7 | 15B | S2 | 115 | S3 | 115 | S2 | 081 | S3 | 081 | S2 | 09A | S3 | 09A | S2 |
| 6E | 171 | S7 | 163 | S2 | 119 | S3 | 119 | S2 | 085 | S3 | 085 | S2 | 0A4 | S3 | 0A4 | S2 |
| 6F | 173 | S7 | 16B | S2 | 121 | S3 | 121 | S2 | 089 | S3 | 089 | S2 | 0A6 | S3 | 0A6 | S2 |
| 70 | 091 | S3 | 091 | S2 | 125 | S3 | 125 | S2 | 031 | S7 | 031 | S6 | 0C0 | S3 | 0C0 | S2 |
| 71 | 095 | S3 | 095 | S2 | 129 | S3 | 129 | S2 | 035 | S7 | 035 | S6 | 0C2 | S3 | 0C2 | S2 |
| 72 | 099 | S3 | 099 | S2 | 12D | S3 | 12D | S2 | 041 | S7 | 041 | S6 | 0C4 | S3 | 0C4 | S2 |
| 73 | 0A1 | S3 | 0A1 | S2 | 131 | S3 | 131 | S2 | 045 | S7 | 045 | S6 | 0C6 | S3 | 0C6 | S2 |
| 74 | 0A5 | S3 | 0A5 | S2 | 135 | S3 | 135 | S2 | 049 | S7 | 049 | S6 | 0C8 | S3 | 0C8 | S2 |
| 75 | 0A9 | S3 | 0A9 | S2 | 141 | S3 | 141 | S2 | 04D | S7 | 04D | S6 | 0CA | S3 | 0CA | S2 |
| 76 | 0AD | S3 | 0AD | S2 | 145 | S3 | 145 | S2 | 051 | S7 | 051 | S6 | 0B0 | S3 | 0B0 | S2 |
| 77 | 0B1 | S3 | 0B1 | S2 | 149 | S3 | 149 | S2 | 055 | S7 | 055 | S6 | 0B2 | S3 | 0B2 | S2 |
| 78 | 0B5 | S3 | 0B5 | S2 | 14D | S3 | 14D | S2 | 001 | S3 | 001 | S2 | 0D0 | S3 | 0D0 | S2 |
| 79 | 0C1 | S3 | 0C1 | S2 | 151 | S3 | 151 | S2 | 005 | S3 | 005 | S2 | 0D2 | S3 | 0D2 | S2 |
| 7A | 0C5 | S3 | 0C5 | S2 | 155 | S3 | 155 | S2 | 009 | S3 | 009 | S2 | 0D4 | S3 | 0D4 | S2 |
| 7B | 0C9 | S3 | 0C9 | S2 | 159 | S3 | 159 | S2 | 00D | S3 | 00D | S2 | 0D6 | S3 | 0D6 | S2 |
| 7C | 0CD | S3 | 0CD | S2 | 161 | S3 | 161 | S2 | 011 | S3 | 011 | S2 | 0D8 | S3 | 0D8 | S2 |
| 7D | 0D1 | S3 | 0D1 | S2 | 165 | S3 | 165 | S2 | 015 | S3 | 015 | S2 | 0DA | S3 | 0DA | S2 |
| 7E | 0D5 | S3 | 0D5 | S2 | 169 | S3 | 169 | S2 | 019 | S3 | 019 | S2 | 0B4 | S3 | 0B4 | S2 |
| 7F | 0D9 | S3 | 0D9 | S2 | 16D | S3 | 16D | S2 | 021 | S3 | 021 | S2 | 0B6 | S3 | 0B6 | S2 |
| 80 | 1C2 | S5 | 1AE | S4 | 11C | S1 | 11C | S0 | 028 | S5 | 028 | S4 | 00C | S3 | 00C | S4 |
| 81 | 182 | S5 | 182 | S4 | 102 | S5 | 102 | S4 | 02A | S5 | 02A | S4 | 002 | S5 | 002 | S4 |
| 82 | 184 | S5 | 184 | S4 | 104 | S5 | 104 | S4 | 02C | S5 | 02C | S4 | 004 | S5 | 004 | S4 |
| 83 | 186 | S5 | 186 | S4 | 106 | S5 | 106 | S4 | 04C | S5 | 04C | S4 | 006 | S5 | 006 | S4 |
| 84 | 188 | S5 | 188 | S4 | 108 | S5 | 108 | S4 | 0A8 | S5 | 0A8 | 94 | 008 | S5 | 008 | S4 |
| 85 | 18A | S5 | 18A | S4 | 10A | S5 | 10A | S4 | 0AA | S5 | 0AA | S4 | 00A | S5 | 00A | S4 |
| 86 | 18C | S5 | 18C | S4 | 10C | S5 | 10C | S4 | 0AC | S5 | 0AC | S4 | 020 | S5 | 020 | S4 |
| 87 | 190 | S5 | 190 | S4 | 110 | S5 | 110 | S4 | 08C | S5 | 08C | S4 | 022 | S5 | 022 | S4 |
| 88 | 192 | S5 | 192 | S4 | 112 | S5 | 112 | S4 | 060 | S5 | 060 | S4 | 010 | S5 | 010 | S4 |
| 89 | 194 | S5 | 194 | S4 | 114 | S5 | 114 | S4 | 062 | S5 | 062 | S4 | 012 | S5 | 012 | S4 |
| 8A | 196 | S5 | 196 | S4 | 116 | S5 | 116 | S4 | 064 | S5 | 064 | S4 | 014 | S5 | 014 | S4 |
| 8B | 198 | S5 | 198 | S4 | 118 | S5 | 118 | S4 | 068 | S5 | 068 | S4 | 016 | S5 | 016 | S4 |
| 8C | 19A | S5 | 19A | S4 | 11A | S5 | 11A | S4 | 06A | S5 | 06A | S4 | 018 | S5 | 018 | S4 |
| 8D | 1A0 | S5 | 1A0 | S4 | 120 | S5 | 120 | S4 | 06C | S5 | 06C | S4 | 01A | S5 | 01A | S4 |
| 8E | 1A2 | S5 | 1A2 | S4 | 122 | S5 | 122 | S4 | 05C | S5 | 02E | C4 | 024 | S5 | 024 | S4 |
| 8F | 1A4 | S5 | 1A4 | S4 | 124 | S5 | 124 | S4 | 072 | S5 | 03A | S4 | 026 | S5 | 026 | S4 |
| 90 | 1A6 | S5 | 1A6 | S4 | 126 | S5 | 126 | S4 | 074 | S5 | 04E | S4 | 040 | S5 | 040 | S4 |
| 91 | 1A8 | S5 | 1A8 | S4 | 128 | S5 | 128 | S4 | 076 | S5 | 06E | S4 | 042 | S5 | 042 | S4 |
| 92 | 1AA | S5 | 1AA | S4 | 12A | S5 | 12A | S4 | 09C | S5 | 08E | S4 | 044 | S5 | 044 | S4 |
| 93 | 1AC | S5 | 1AC | S4 | 12C | S5 | 12C | S4 | 0DC | S5 | 0AE | S4 | 046 | S5 | 046 | S4 |
| 94 | 1B0 | S5 | 1B0 | S4 | 130 | S5 | 130 | S4 | 017 | S5 | 0B8 | S4 | 048 | S5 | 048 | S4 |
| 95 | 1B2 | S5 | 1B2 | S4 | 132 | S5 | 132 | S4 | 027 | S5 | 0BA | S4 | 04A | S5 | 04A | S4 |
| 96 | 1B4 | S5 | 1B4 | S4 | 134 | S5 | 134 | S4 | 037 | S5 | 0CE | S4 | 030 | S5 | 030 | S4 |
| 97 | 1B6 | S5 | 1B6 | S4 | 136 | S5 | 136 | S4 | 047 | S5 | 0E2 | S4 | 032 | S5 | 032 | S4 |
| 98 | 181 | S5 | 181 | S4 | 11C | S5 | 138 | S4 | 057 | S5 | 0EA | S4 | 050 | S5 | 050 | S4 |
| 99 | 185 | S5 | 185 | S4 | 142 | S5 | 142 | S4 | 067 | S5 | 0E6 | S4 | 052 | S5 | 052 | S4 |
| 9A | 189 | S5 | 189 | S4 | 144 | S5 | 144 | S4 | 087 | S5 | 0E8 | S4 | 054 | S5 | 054 | S4 |
| 9B | 18D | S5 | 18D | S4 | 146 | S5 | 146 | S4 | 097 | S5 | 0EA | S4 | 056 | S5 | 056 | S4 |
| 9C | 191 | S5 | 191 | S4 | 148 | S5 | 148 | S4 | 0A7 | S5 | 0EC | S4 | 058 | S5 | 058 | S4 |
| 9D | 195 | S5 | 195 | S4 | 14A | S5 | 14A | S4 | 0B7 | S5 | 03B | S4 | 05A | S5 | 05A | S4 |
| 9E | 1A1 | S5 | 1A1 | S4 | 14C | S5 | 14C | S4 | 0C7 | S5 | 0BB | S4 | 034 | S5 | 034 | S4 |
| 9F | 1A5 | S5 | 1A5 | S4 | 150 | S5 | 150 | S4 | 0D7 | S5 | 0EB | S4 | 036 | S5 | 036 | S4 |
| A0 | 1A9 | S5 | 1A9 | S4 | 152 | S5 | 152 | S4 | 003 | S5 | 003 | S4 | 080 | S5 | 080 | S4 |
| A1 | 1AD | S5 | 1AD | S4 | 154 | S5 | 154 | S4 | 00B | S5 | 00B | S4 | 082 | S5 | 082 | S4 |
| A2 | 1B1 | S5 | 1B1 | S4 | 156 | S5 | 156 | S4 | 013 | S5 | 013 | S4 | 084 | S5 | 084 | S4 |
| A3 | 1B5 | S5 | 1B5 | S4 | 158 | S5 | 158 | S4 | 01B | S5 | 01B | S4 | 086 | S5 | 086 | S4 |
| A4 | 103 | S5 | 103 | S4 | 15A | S5 | 15A | S4 | 023 | S5 | 023 | S4 | 088 | S5 | 088 | S4 |

TABLE 2-continued

| | State 0 (S0) | | State 1 (S1) | | State 2 (S2) | | State 3 (S3) | | State 4 (S4) | | State 5 (S5) | | State 6 (S6) | | State 7 (S7) | |
|---|---|---|---|---|---|---|---|---|---|---|---|---|---|---|---|---|
| Data | Code | NS | Code | NS | Code | NS | Code | NS | Code | NS | Code | NS | Code | NS | Code | NS |
| A5 | 10B | S5 | 10B | S4 | 160 | S5 | 160 | S4 | 02B | S5 | 02B | S4 | 08A | S5 | 08A | S4 |
| A6 | 113 | S5 | 113 | S4 | 162 | S5 | 162 | S4 | 033 | S5 | 033 | S4 | 0A0 | S5 | 0A0 | S4 |
| A7 | 11B | S5 | 11B | S4 | 164 | S5 | 164 | S4 | 043 | S5 | 043 | S4 | 0A2 | S5 | 0A2 | S4 |
| A8 | 123 | S5 | 123 | S4 | 166 | S5 | 166 | S4 | 04B | S5 | 04B | S4 | 090 | S5 | 090 | S4 |
| A9 | 12B | S5 | 12B | S4 | 168 | S5 | 168 | S4 | 053 | S5 | 053 | S4 | 092 | S5 | 092 | S4 |
| AA | 143 | S5 | 143 | S4 | 16A | S5 | 16A | S4 | 05B | S5 | 05B | S4 | 094 | S5 | 094 | S4 |
| AB | 14B | S5 | 14B | S4 | 16C | S5 | 16C | S4 | 063 | S5 | 063 | S4 | 096 | S5 | 096 | S4 |
| AC | 153 | S5 | 153 | S4 | 111 | S5 | 111 | S4 | 06B | S5 | 06B | S4 | 098 | S5 | 098 | S4 |
| AD | 15B | S5 | 15B | S4 | 115 | S5 | 115 | S4 | 083 | S5 | 083 | S4 | 09A | S5 | 09A | S4 |
| AE | 163 | S5 | 163 | S4 | 119 | S5 | 119 | S4 | 08B | S5 | 08B | S4 | 0A4 | S5 | 0A4 | S4 |
| AF | 16B | S5 | 16B | S4 | 121 | S5 | 121 | S4 | 093 | S5 | 093 | S4 | 0A6 | S5 | 0A6 | S4 |
| B0 | 091 | S5 | 091 | S4 | 125 | S5 | 125 | S4 | 09B | S5 | 09B | S4 | 0C0 | S5 | 0C0 | S4 |
| B1 | 095 | S5 | 095 | S4 | 129 | S5 | 129 | S4 | 0A3 | S5 | 0A3 | S4 | 0C2 | S5 | 0C2 | S4 |
| B2 | 099 | S5 | 099 | S4 | 12D | S5 | 12D | S4 | 0AB | S5 | 0AB | S4 | 0C4 | S5 | 0C4 | S4 |
| B3 | 0A1 | S5 | 0A1 | S4 | 131 | S5 | 131 | S4 | 0B3 | S5 | 0B3 | S4 | 0C6 | S5 | 0C6 | S4 |
| B4 | 0A5 | S5 | 0A5 | S4 | 135 | S5 | 135 | S4 | 0C3 | S5 | 0C3 | S4 | 0C8 | S5 | 0C8 | S4 |
| B5 | 0A9 | S5 | 0A9 | S4 | 141 | S5 | 141 | S4 | 0CB | S5 | 0CB | S4 | 0CA | S5 | 0CA | S4 |
| B6 | 0AD | S5 | 0AD | S4 | 145 | S5 | 145 | S4 | 0D3 | S5 | 0D3 | S4 | 0B0 | S5 | 0B0 | S4 |
| B7 | 0B1 | S5 | 0B1 | S4 | 149 | S5 | 149 | S4 | 0DB | S5 | 0DB | S4 | 0B2 | S5 | 0B2 | S4 |
| B8 | 0B5 | S5 | 0B5 | S4 | 14D | S5 | 14D | S4 | 001 | S5 | 001 | S4 | 0D0 | S5 | 0D0 | S4 |
| B9 | 0C1 | S5 | 0C1 | S4 | 151 | S5 | 151 | S4 | 005 | S5 | 005 | S4 | 0D2 | S5 | 0D2 | S4 |
| BA | 0C5 | S5 | 0C5 | S4 | 155 | S5 | 155 | S4 | 009 | S5 | 009 | S4 | 0D4 | S5 | 0D4 | S4 |
| BB | 0C9 | S5 | 0C9 | S4 | 159 | S5 | 159 | S4 | 00D | S5 | 00D | S4 | 0D6 | S5 | 0D6 | S4 |
| BC | 0CD | S5 | 0CD | S4 | 161 | S5 | 161 | S4 | 011 | S5 | 011 | S4 | 0D8 | S5 | 0D8 | S4 |
| BD | 0D1 | S5 | 0D1 | S4 | 165 | S5 | 165 | S4 | 015 | S5 | 015 | S4 | 0DA | S5 | 0DA | S4 |
| BE | 0D5 | S5 | 0D5 | S4 | 169 | S5 | 169 | S4 | 019 | S5 | 019 | S4 | 0B4 | S5 | 0B4 | S4 |
| BF | 0D9 | S5 | 0D9 | S4 | 16D | S5 | 16D | S4 | 021 | S5 | 021 | S4 | 0B6 | S5 | 0B6 | S4 |
| C0 | 1C2 | S7 | 1AE | S6 | 11C | S3 | 138 | S2 | 028 | S7 | 028 | S6 | 00C | S7 | 00C | S6 |
| C1 | 182 | S7 | 182 | S6 | 102 | S7 | 102 | S6 | 02A | S7 | 02A | S6 | 002 | S7 | 002 | S6 |
| C2 | 184 | S7 | 184 | S6 | 104 | S7 | 104 | S6 | 02C | S7 | 02C | S6 | 004 | S7 | 004 | S6 |
| C3 | 186 | S7 | 186 | S6 | 106 | S7 | 106 | S6 | 04C | S7 | 04C | S6 | 006 | S7 | 006 | S6 |
| C4 | 188 | S7 | 188 | S6 | 108 | S7 | 108 | S6 | 0A8 | S7 | 0A8 | S6 | 008 | S7 | 008 | S6 |
| C5 | 18A | S7 | 18A | S6 | 10A | S7 | 10A | S6 | 0AA | S7 | 0AA | S6 | 00A | S7 | 00A | S6 |
| C6 | 18C | S7 | 18C | S6 | 10C | S7 | 10C | S6 | 0AC | S7 | 0AC | S6 | 020 | S7 | 020 | S6 |
| C7 | 190 | S7 | 190 | S6 | 110 | S7 | 110 | S6 | 08C | S7 | 08C | S6 | 022 | S7 | 022 | S6 |
| C8 | 192 | S7 | 192 | S6 | 112 | S7 | 112 | S6 | 060 | S7 | 060 | S6 | 010 | S7 | 010 | S6 |
| C9 | 194 | S7 | 194 | S6 | 114 | S7 | 114 | S6 | 062 | S7 | 062 | S6 | 012 | S7 | 012 | S6 |
| CA | 196 | S7 | 196 | S6 | 116 | S7 | 116 | S6 | 064 | S7 | 064 | S6 | 014 | S7 | 014 | S6 |
| CB | 198 | S7 | 198 | S6 | 118 | S7 | 118 | S6 | 068 | S7 | 068 | S6 | 016 | S7 | 016 | S6 |
| CC | 19A | S7 | 19A | S6 | 11A | S7 | 11A | S6 | 06A | S7 | 06A | S6 | 018 | S7 | 018 | S6 |
| CD | 1A0 | S7 | 1A0 | S6 | 120 | S7 | 120 | S6 | 06C | S7 | 06C | S6 | 01A | S7 | 01A | S6 |
| CE | 1A2 | S7 | 1A2 | S6 | 122 | S7 | 122 | S6 | 05C | S7 | 02E | S6 | 024 | S7 | 024 | S6 |
| CF | 1A4 | S7 | 1A4 | S6 | 124 | S7 | 124 | S6 | 072 | S7 | 03A | S6 | 026 | S7 | 026 | S6 |
| D0 | 1A6 | S7 | 1A6 | S6 | 126 | S7 | 126 | S6 | 074 | S7 | 04E | S6 | 040 | S7 | 040 | S6 |
| D1 | 1A8 | S7 | 1A8 | S6 | 128 | S7 | 128 | S6 | 076 | S7 | 06E | S6 | 042 | S7 | 042 | S6 |
| D2 | 1AA | S7 | 1AA | S6 | 12A | S7 | 12A | S6 | 09C | S7 | 08E | S6 | 044 | S7 | 044 | S6 |
| D3 | 1AC | S7 | 1AC | S6 | 12C | S7 | 12C | S6 | 0DC | S7 | 0AE | S6 | 046 | S7 | 046 | S6 |
| D4 | 1B0 | S7 | 1B0 | S6 | 130 | S7 | 130 | S6 | 017 | S7 | 0B8 | S6 | 048 | S7 | 048 | S6 |
| D5 | 1B2 | S7 | 1B2 | S6 | 132 | S7 | 132 | S6 | 027 | S7 | 0BA | S6 | 04A | S7 | 04A | S6 |
| D6 | 1B4 | S7 | 1B4 | S6 | 134 | S7 | 134 | S6 | 037 | S7 | 0CE | S6 | 030 | S7 | 030 | S6 |
| D7 | 1B6 | S7 | 1B6 | S6 | 136 | S7 | 136 | S6 | 047 | S7 | 0E2 | S6 | 032 | S7 | 032 | S6 |
| D8 | 181 | S7 | 181 | S6 | 11C | S7 | 138 | S6 | 057 | S7 | 0EA | S6 | 050 | S7 | 050 | S6 |
| D9 | 185 | S7 | 185 | S6 | 142 | S7 | 142 | S6 | 067 | S7 | 0E6 | S6 | 052 | S7 | 052 | S6 |
| DA | 189 | S7 | 189 | S6 | 144 | S7 | 144 | S6 | 087 | S7 | 0E8 | S6 | 054 | S7 | 054 | S6 |
| DB | 18D | S7 | 18D | S6 | 146 | S7 | 146 | S6 | 097 | S7 | 0EA | S6 | 056 | S7 | 056 | S6 |
| DC | 191 | S7 | 191 | S6 | 148 | S7 | 148 | S6 | 0A7 | S7 | 0EC | S6 | 058 | S7 | 058 | S6 |
| DD | 195 | S7 | 195 | S6 | 14A | S7 | 14A | S6 | 0B7 | S7 | 03B | S6 | 05A | S7 | 05A | S6 |
| DE | 1A1 | S7 | 1A1 | S6 | 14C | S7 | 14C | S6 | 0C7 | S7 | 0BB | S6 | 034 | S7 | 034 | S6 |
| DF | 1A5 | S7 | 1A5 | S6 | 150 | S7 | 150 | S6 | 0D7 | S7 | 0EB | S6 | 036 | S7 | 036 | S6 |
| E0 | 1A9 | S7 | 1A9 | S6 | 152 | S7 | 152 | S6 | 003 | S7 | 003 | S6 | 080 | S7 | 080 | S6 |
| E1 | 1AD | S7 | 1AD | S6 | 154 | S7 | 154 | S6 | 00B | S7 | 00B | S6 | 082 | S7 | 082 | S6 |
| E2 | 1B1 | S7 | 1B1 | S6 | 156 | S7 | 156 | S6 | 013 | S7 | 013 | S6 | 084 | S7 | 084 | S6 |
| E3 | 1B5 | S7 | 1B5 | S6 | 158 | S7 | 158 | S6 | 01B | S7 | 01B | S6 | 086 | S7 | 086 | S6 |
| E4 | 103 | S7 | 103 | S6 | 15A | S7 | 15A | S6 | 023 | S7 | 023 | S6 | 088 | S7 | 088 | S6 |
| E5 | 10B | S7 | 10B | S6 | 160 | S7 | 160 | S6 | 02B | S7 | 02B | S6 | 08A | S7 | 08A | S6 |
| E6 | 113 | S7 | 113 | S6 | 162 | S7 | 162 | S6 | 033 | S7 | 033 | S6 | 0A0 | S7 | 0A0 | S6 |
| E7 | 11B | S7 | 11B | S6 | 164 | S7 | 164 | S6 | 043 | S7 | 043 | S6 | 0A2 | S7 | 0A2 | S6 |
| E8 | 123 | S7 | 123 | S6 | 166 | S7 | 166 | S6 | 04B | S7 | 04B | S6 | 090 | S7 | 090 | S6 |
| E9 | 12B | S7 | 12B | S6 | 168 | S7 | 168 | S6 | 053 | S7 | 053 | S6 | 092 | S7 | 092 | S6 |
| EA | 143 | S7 | 143 | S6 | 16A | S7 | 16A | S6 | 05B | S7 | 05B | S6 | 094 | S7 | 094 | S6 |
| EB | 14B | S7 | 14B | S6 | 16C | S7 | 16C | S6 | 063 | S7 | 063 | S6 | 096 | S7 | 096 | S6 |
| EC | 153 | S7 | 153 | S6 | 111 | S7 | 111 | S6 | 06B | S7 | 06B | S6 | 098 | S7 | 098 | S6 |
| ED | 15B | S7 | 15B | S6 | 115 | S7 | 115 | S6 | 083 | S7 | 083 | S6 | 09A | S7 | 09A | S6 |
| EE | 163 | S7 | 163 | S6 | 119 | S7 | 119 | S6 | 08B | S7 | 08B | S6 | 0A4 | S7 | 0A4 | S6 |

TABLE 2-continued

| | State 0 (S0) | | State 1 (S1) | | State 2 (S2) | | State 3 (S3) | | State 4 (S4) | | State 5 (S5) | | State 6 (S6) | | State 7 (S7) | |
|---|---|---|---|---|---|---|---|---|---|---|---|---|---|---|---|---|
| Data | Code | NS | Code | NS | Code | NS | Code | NS | Code | NS | Code | NS | Code | NS | Code | NS |
| EF | 16B | S7 | 16B | S6 | 121 | S7 | 121 | S6 | 093 | S7 | 093 | S6 | 0A6 | S7 | 0A6 | S6 |
| F0 | 091 | S7 | 091 | S6 | 125 | S7 | 125 | S6 | 09B | S7 | 09B | S6 | 0C0 | S7 | 0C0 | S6 |
| F1 | 095 | S7 | 095 | S6 | 129 | S7 | 129 | S6 | 0A3 | S7 | 0A3 | S6 | 0C2 | S7 | 0C2 | S6 |
| F2 | 099 | S7 | 099 | S6 | 12D | S7 | 12D | S6 | 0AB | S7 | 0AB | S6 | 0C4 | S7 | 0C4 | S6 |
| F3 | 0A1 | S7 | 0A1 | S6 | 131 | S7 | 131 | S6 | 0B3 | S7 | 0B3 | S6 | 0C6 | S7 | 0C6 | S6 |
| F4 | 0A5 | S7 | 0A5 | S6 | 135 | S7 | 135 | S6 | 0C3 | S7 | 0C3 | S6 | 0C8 | S7 | 0C8 | S6 |
| F5 | 0A9 | S7 | 0A9 | S6 | 141 | S7 | 141 | S6 | 0CB | S7 | 0CB | S6 | 0CA | S7 | 0CA | S6 |
| F6 | 0AD | S7 | 0AD | S6 | 145 | S7 | 145 | S6 | 0D3 | S7 | 0D3 | S6 | 0B0 | S7 | 0B0 | S6 |
| F7 | 0B1 | S7 | 0B1 | S6 | 149 | S7 | 149 | S6 | 0DB | S7 | 0DB | S6 | 0B2 | S7 | 0B2 | S6 |
| F8 | 0B5 | S7 | 0B5 | S6 | 14D | S7 | 14D | S6 | 001 | S7 | 001 | S6 | 0D0 | S7 | 0D0 | S6 |
| F9 | 0C1 | S7 | 0C1 | S6 | 151 | S7 | 151 | S6 | 005 | S7 | 005 | S6 | 0D2 | S7 | 0D2 | S6 |
| FA | 0C5 | S7 | 0C5 | S6 | 155 | S7 | 155 | S6 | 009 | S7 | 009 | S6 | 0D4 | S7 | 0D4 | S6 |
| FB | 0C9 | S7 | 0C9 | S6 | 159 | S7 | 159 | S6 | 00D | S7 | 00D | S6 | 0D6 | S7 | 0D6 | S6 |
| FC | 0CD | S7 | 0CD | S6 | 161 | S7 | 161 | S6 | 011 | S7 | 011 | S6 | 0D8 | S7 | 0D8 | S6 |
| FD | 0D1 | S7 | 0D1 | S6 | 165 | S7 | 165 | S6 | 015 | S7 | 015 | S6 | 0DA | S7 | 0DA | S6 |
| FE | 0D5 | S7 | 0D5 | S6 | 169 | S7 | 169 | S6 | 019 | S7 | 019 | S6 | 0B4 | S7 | 0B4 | S6 |
| FF | 0D9 | S7 | 0D9 | S6 | 16D | S7 | 16D | S6 | 021 | S7 | 021 | S6 | 0B6 | S7 | 0B6 | S6 |

In designing encoding/decoding Tables 1 and 2, undesirable patterns or long-run patterns with small Euclidean distances are avoided. For example, patterns of repeating tribits, "11101110 . . . " are eliminated. In addition, patterns with long runs of "11001100 . . . " are eliminated as these patterns may force the detector to keep a long memory length. Thus, not all of the 317 possible code words that meet the MTR constraint of two for even bit locations and three for odd bit locations appear in the tables and not all of the 356 code words that satisfy the MTR constraint of three for even bit locations and two for odd bit locations appear in the tables.

Figure 4:
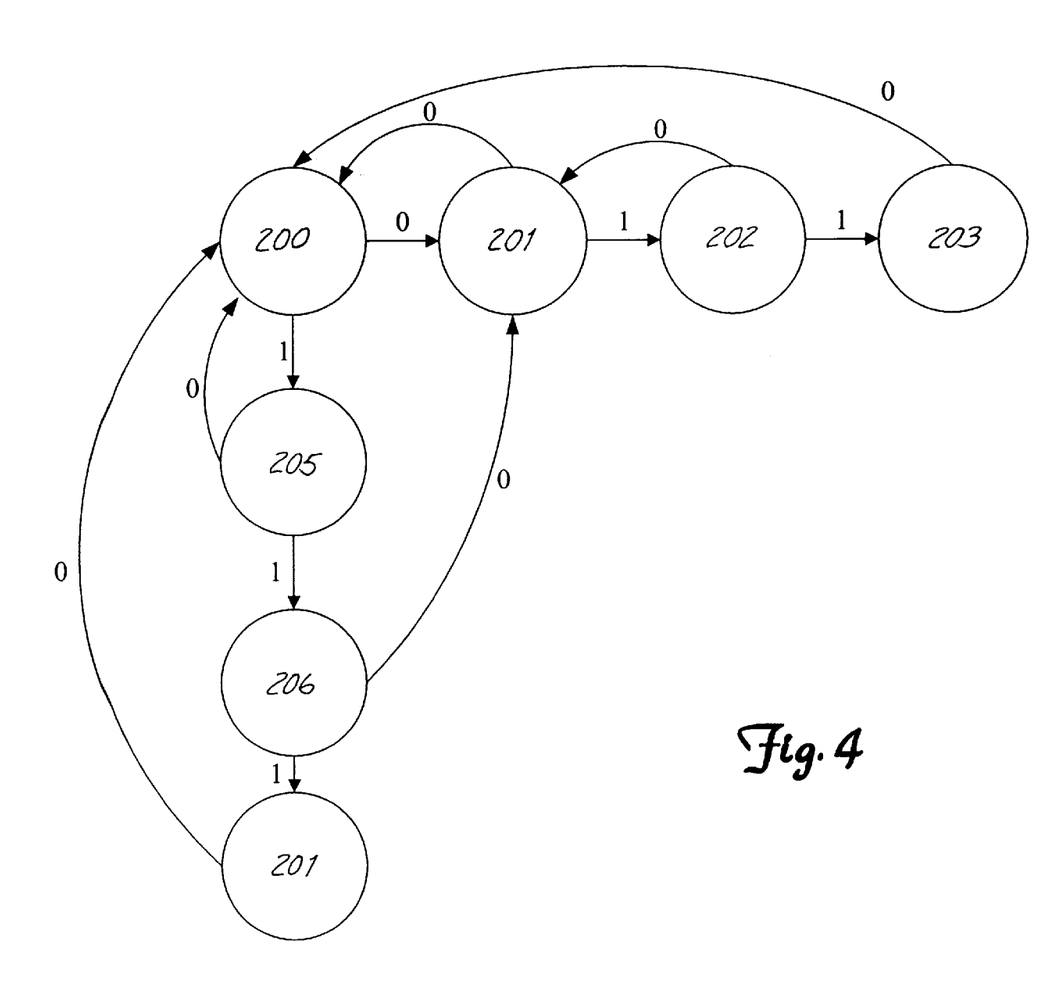
FIG. 4 is a state diagram for the code of the present invention.

FIG. 4 shows a state diagram for the present invention's universal MTR code of three for even bit locations and two for odd bit locations. State 200 represents the initial state of the encoder/decoder, which is an even bit location. If the bit associated with state 200 is '0', the code moves to state 201, which is an odd bit location. If the bit associated with state 201 is '0', the code returns to state 200. If the associated bit is '1', the code advances to state 202.

State 202 is associated with an even bit location and if that bit location contains a '0', the code returns to state 201. If the bit location contains a '1', the code moves to state 203, which is associated with an odd bit location. Since state 203 only occurs after two consecutive ones beginning from an odd bit location, the bit associated with state 203 must be '0', causing the code to return to state 200.

If the bit associated with state 200 is '1', the code goes to state 205, which is associated with an odd bit location. If the value of the bit associated with state 205 is '0', the code returns to state 200. If the value of the bit associated with state 205 is '1', the code moves to state 206, which is associated with an even location. A '0' in the even bit location of state 206 moves the code to state 201. A '1' in the even bit location associated with state 206 moves the code to state 207. Since state 207 is associated with three consecutive ones beginning from an even bit location, the MTR constraint of three for even bit locations requires that the bit associated with the odd location of state 207 be '0' and the code returns to state 200.

In summary, the present invention provides a method and apparatus for producing a code stream 158. The coding system includes an encoder 150 capable of converting data values 152 into a series of code symbols 154 in alternating even 188 and odd 186 locations, such that fewer than a first maximum transition run limit of consecutive same first code symbols start from any even bit location 188 and fewer than a second number of consecutive same first symbols start from any odd bit location 186. The coding system further includes a transmitter 156 coupled to encoder 150 and to channel 160 and capable of transmitting an encoded signal based on the series of code symbols 154.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the coding method and apparatus while maintaining substantially the same functionality without departing from the scope and spirit of the present invention. In addition, although the preferred embodiment described herein is directed to a coding system for a disc drive, it will be appreciated by those skilled in the art that the teachings of the present invention can be applied to other systems, like satellite communications or cellular phone systems, without departing from the scope and spirit of the present invention.

What is claimed is:

1. A disc drive for performing data operations relative to a rotating disc, the disc drive comprising:

(a) a transducer assembly which transfers signals representative of information between the disc and a channel device; and (b) code means, coupled to the transducer assembly, for producing a code stream of code words from an input stream of bits from the channel device, each code word comprising at least two subsets of code bits, each subset of code bits constrained by a different maximum transition run constraint.

2. The disc drive of claim 1 wherein a first subset of code bits are code bits that occur in even bit locations within a code word and a second subset of code bits are code bits that occur in odd bit locations with a code word.

3. The disc drive of claim 2 wherein the maximum transition run constraint of the first subset of code bits is two and the maximum transition run constraint of the second subset of code bits is three.

4. The disc drive of claim 2 wherein each code word comprises an odd number of code bits.

5. The disc drive of claim 2 wherein the code means treats as invalid a concatenation of code words that individually meet the maximum transition run constraint if the concatenation violates the maximum transition run constraint for at least one bit in one of the code words.

6. The disc drive of claim 2 wherein groups of eight bits from the input stream of bits are encoded as nine symbols of encoded data.

7. A disc drive for performing data operations relative to a rotating disc, the disc drive comprising:
   (a) a transducer assembly which transfers signals representative of information between the disc and a channel device; and
   (b) code means, coupled to the transducer, for producing a code stream from an input stream of bits from the channel device of alternating even bit locations and odd bit locations, the even bit locations constrained by a different maximum transition run constraint than the odd bit locations.

8. The disc drive of claim 7 wherein the code stream comprises at least one code word with an odd number of bits.

9. The disc drive of claim 7 wherein the code stream is comprised of alternating first code words and second code words, the first code words comprising alternating first-word even-bit locations and first-word odd-bit locations and starting with a first-word even-bit location, the second code words comprising alternating second-word even-bit locations and second-word odd-bit locations and starting with a second-word even-bit location, the first-word even-bit locations being constrained by a different maximum transition run constraint than the second-word even-bit locations.

10. The disc drive of claim 9 wherein the first-word odd-bit locations are constrained by a different maximum transition run constraint than the second-word odd-bit locations.

11. The disc drive of claim 9 wherein the first-word even-bit locations are constrained by the same maximum transition run constraint as the second-word odd-bit locations.

12. A method of selecting code words for a coding system, the method comprising steps of:
   (a) forming code words, each code word having fewer than a first maximum transition run limit of consecutive symbols that begin from even numbered positions within the respective code word and having fewer than a second maximum transition run limit of consecutive symbols that begin from odd numbered positions within the respective code word, the first number being different from the second number;
   (b) dividing code words into at least two subsets of code words; and
   (c) assigning a next state value to each code word indicating the subset from which the next code word is to be selected.

13. The method of claim 12 wherein the subsets and the next state values are chosen so that even numbered positions within any code word of two concatenated code words do not exceed the first maximum transition run limit and so that odd numbered positions within any code word of two concatenated code words do not exceed the second maximum transition run limit.

14. The method of claim 13 wherein the first maximum transition run limit is three and the second maximum transition run limit is two.

15. The method of claim 13 wherein each code word is nine symbols long.

16. A method of selecting code words for a coding system, the method comprising steps of:
   (a) forming a set of first code words, each first code word having fewer than a first maximum transition run limit of consecutive symbols that begin from even numbered positions within the respective code word and having fewer than a second maximum transition run limit of consecutive symbols that begin from odd numbered positions within the respective code word, the first maximum transition run limit being different from the second maximum transition run limit;
   (b) forming a set of second code words, each second code word having fewer than the second maximum transition run limit of consecutive symbols that begin from even numbered positions within the respective code word and having fewer than the first maximum transition run limit of consecutive symbols that begin from odd numbered positions within the respective code word;
   (c) dividing the sets of first and second code words into at least four subsets of code words; and
   (d) assigning a next state value to each code word indicating the subset from which the next code word is to be selected.

17. The method of claim 16 wherein the next state value for a second code word causes a first code word to be selected next.

18. The method of claim 16 further comprising a constraining step wherein the operations of the dividing step (c) and the assigning step (e) are constrained so that after concatenation of code words several conditions are met, including:
   (i) a string of more than the first maximum transition run limit of consecutive symbols does not begin from an even numbered position within any first code word;
   (ii) a string of more than the first maximum transition run limit of consecutive symbols does not begin from an odd numbered position within any second code word;
   (iii) a string of more than the second maximum transition run limit of consecutive symbols does not begin from an odd numbered position within any first code word; and
   (iv) a string of more than the second maximum transition run limit of consecutive symbols does not begin from an even numbered position within any second code word.

19. A coding system for passing encoded signals through a channel, the coding system comprising:
   (a) an encoder, capable of converting data values into a series of code values having alternating even and odd code symbol locations, such that fewer than a first number of consecutive same code symbols start from even code symbol locations in a code value and fewer than a second number of consecutive same code symbols start from odd code symbol locations in a code value; and
   (b) a transmitter, coupled to the encoder and the channel and capable of transmitting an encoded signal based on the series of code symbols.

20. The code system of claim 19 wherein each code value has an odd number of symbols.

21. A coding system for passing encoded signals through a channel, the coding system comprising:
- (a) an encoder, capable of converting data values into an alternating series of first code values and second code values, the first code values having alternating first-code even symbol locations and first-code odd symbol locations, the second code values having alternating second-code even symbol locations and second-code odd symbol locations, the encoder converting the data values such that:
  - (a)(i) fewer than a first maximum transition run limit of consecutive same code symbols start from first-code even symbol locations;
  - (a)(ii) fewer than the first maximum transition run limit of consecutive same code symbols start from second-code odd symbol locations;
  - (a)(iii) fewer than a second maximum transition run limit of consecutive same code symbols start from first-code odd symbol locations; and
  - (a)(iv) fewer than the second maximum transition run limit of consecutive same code symbols start from second-code even symbol locations, the first number of consecutive same code symbols different from the second number of consecutive same code symbols; and
- (b) a transmitter, coupled to the encoder and the channel and capable of transmitting an encoded signal based on the series of code symbols.

* * * * *